(12) United States Patent
Ozawa

(10) Patent No.: US 9,887,625 B2
(45) Date of Patent: Feb. 6, 2018

(54) OUTPUT CURRENT MONITOR CIRCUIT FOR SWITCHING REGULATOR

(71) Applicant: Dialog Semiconductor (UK) Limited, Reading (GB)

(72) Inventor: Seiichi Ozawa, Saitama (JP)

(73) Assignee: Dialog Semiconductor (UK) Limited, Reading (GB)

( * ) Notice: Subject to any disclaimer, the term of this patent is extended or adjusted under 35 U.S.C. 154(b) by 0 days.

(21) Appl. No.: 14/795,147

(22) Filed: Jul. 9, 2015

(65) Prior Publication Data

US 2017/0012527 A1 Jan. 12, 2017

(51) Int. Cl.
*H02M 3/158* (2006.01)
*H03K 5/1536* (2006.01)
*H02M 3/156* (2006.01)
*H02M 1/00* (2006.01)

(52) U.S. Cl.
CPC ............ *H02M 3/158* (2013.01); *H02M 3/156* (2013.01); *H02M 3/1588* (2013.01); *H02M 2001/0009* (2013.01); *H03K 5/1536* (2013.01)

(58) Field of Classification Search
CPC ......... H02M 3/158; H02M 2001/0009; H02M 2001/0054; H02M 3/156; H02M 3/1588; H03K 5/1536
See application file for complete search history.

(56) References Cited

U.S. PATENT DOCUMENTS

| | | | |
|---|---|---|---|
| 6,803,750 B2 | 10/2004 | Zhang | |
| 6,894,464 B2 | 5/2005 | Zhang | |
| 7,019,504 B2 * | 3/2006 | Pullen | H02M 3/156 323/283 |
| 8,643,352 B2 * | 2/2014 | Nakagawara | H02M 3/156 323/283 |

(Continued)

FOREIGN PATENT DOCUMENTS

WO    WO 9931790    6/1999

OTHER PUBLICATIONS

Co-pending US Patent DS13-106, U.S. Appl. No. 14/550,921, filed Nov. 22, 2014, "Output Current Monitor for Switching Regulator," by Seiichi Ozawa, 24 pgs.

*Primary Examiner* — Fred E Finch, III
*Assistant Examiner* — Demetries A Gibson
(74) *Attorney, Agent, or Firm* — Saile Ackerman LLC; Stephen B. Ackerman

(57) ABSTRACT

A circuit and method for providing an improved current monitoring circuit for a switching regulator. A circuit providing switching regulation with an improved current monitor, comprising a pulse width modulation (PWM) controller configured to provide P- and N-drive signals, an output stage connected to said PWM controller and configured to provide switching, comprising a high-side and low-side transistor, driven by said P- and N-drive signals, respectively, a sense circuit configured to provide output current sensing from the output stage during a sampling period when the N-drive (Continued)

signal is active, and a sampling timing generator configured to provide a an n-sampling signal, nsample, to the sense circuit, wherein a start of the n-sampling signal is delayed by a first delay after the sampling period and the n-sampling signal is ended prior to an end of the sampling period by a second delay.

16 Claims, 6 Drawing Sheets

(56) References Cited

U.S. PATENT DOCUMENTS

| | | | |
|---|---|---|---|
| 8,836,304 B2* | 9/2014 | Sheng | H02M 3/156 323/282 |
| 2006/0220734 A1* | 10/2006 | Koen | H03F 1/02 330/9 |
| 2008/0316781 A1 | 12/2008 | Liu | |
| 2009/0296855 A1* | 12/2009 | Kitamura | H03F 1/0261 375/297 |
| 2010/0033146 A1 | 2/2010 | Irissou et al. | |
| 2011/0018513 A1* | 1/2011 | Noda | H02M 3/158 323/282 |
| 2012/0242384 A1* | 9/2012 | Kato | H03L 7/097 327/157 |
| 2014/0191744 A1* | 7/2014 | Choi | H02M 3/156 323/283 |
| 2014/0300389 A1* | 10/2014 | Fowler | H03K 5/1252 327/95 |
| 2015/0194891 A1* | 7/2015 | Kim | H02M 3/156 323/271 |

* cited by examiner

US 9,887,625 B2

OUTPUT CURRENT MONITOR CIRCUIT FOR SWITCHING REGULATOR

RELATED PATENT APPLICATION

This application is related to Ser. No. 14/550,921, filed on Nov. 22, 2014, which is assigned to a common assignee, and which is herein incorporated by reference in its entirety.

BACKGROUND

Field

The disclosure relates generally to a voltage regulator and, more particularly, to output current monitoring circuit thereof.

Description of the Related Art

Voltage regulation is important where circuits are sensitive to transients, noise and other types of disturbances. The control of the regulated voltage over variations in both semiconductor process variation, and temperature is key to many applications. Additionally, power consumption is also a key design requirement.

In a recent power management integrated circuit (PMIC), precise output monitoring of a buck is required for more efficient power management of processors. Average output current is sensed and digitized, and used for controlling processors.

FIG. 1 shows average output current monitor in a circuit known to the inventor. The buck 100 is composed of pulse width modulation (PWM) controller 105 and output stage 130. Output current monitor is sampling timing generator 170, sampler and sense circuit 150. The PWM controller 105 has an input signal from Master clock output signal 102, and Error amplifier 115. The Error amplifier 115 a vout signal 120 and reference signal vref 125. The PWM controller 105 generates two output signals pdrv 111 and ndrv 112. The Output stage 130 contains p-channel metal oxide semiconductor (PMOS) 135 and pre-drive inverter 140, and n-channel metal oxide semiconductor (NMOS 145). The Output stage 130 drives node LX 136 which is connected to inductor 152, capacitor load C 153, and Load 154 for the output voltage level vout 155. The sample timing generator 170 receives a signal from ndrv 112. The sample timing generator 170 contains an AND logic gate 175 and delay device 180. The output of the Sampling timing generator 170 is connected to the Sense 150 to generate an Output current information 160.

FIG. 2 shows the timing diagram 200 for the signals. The master clock PWM controller 105 of FIG. 1 generates PWM signals, pdrv 220 and ndrv 230. Pdrv is activated with master clock rising 210. Pulse width of pdrv is determined by the control signal from the error amplifier. When pdrv 220 is deactivated, ndrv 230 is activated immediately and keeps active until master clock rising 210.

Output stage 130 is composed of PMOS 135 and NMOS 145. PMOS is turned on when pdrv is active and NMOS is turned on when ndrv is active. The output, LX node 136 swings almost rail-to-rail and the inductor current swing in triangular waveform. The voltage drop is caused by the inductor current. The voltage drop during NMOS is turned on is expressed as Rnon*I(LX) using NMOS on-resistance Rnon.

FIG. 2 highlights ndrv delay signal ndrv_dly 240, sample signal nsample 250, and current and voltage of the LX node 136, I (LX) 260, and V (LX) 270. Current monitor circuit is composed of sampling timing generator 170 and sense circuit 150 of FIG. 1. The sense circuit 150 estimates the average output current information 160 from the average of the voltage drop across the NMOS during sampling signal, nsample 250 of FIG. 2 is activated.

Sampling timing generator generates nsample 250 from NMOS on signal, ndrv. The sampling generator of prior art is composed of delay Td1 and AND logic. To wait LX node 136 voltage settling, start of nsample 250 is delayed from ndrv while end of nsample is almost the same as ndrv. So the center of sampling timing is shifted by Td1/2 from the center of NMOS on-timing, and it causes sensing error. Using the delay Td1 180 in the sampling timing generator 170, the sensing error is expressed as:

$$\Delta Isense = dI_{LX}/dt * Td1/2 = -Vout/L * Td1/2$$

It is affected by on the output voltage Vout and inductance L.

U.S. Patent Application 20100033146 to Irissou et al., describes a method for providing output (e.g., current) sensing and feedback in switching power converter topologies. Some embodiments include feedback functionality for generating a converter driver signal (for driving the switching converter) and/or a sample driver signal (for driving the sampling module) as a function of sensed output feedback from the sampling module U.S. Patent Application 20080316781 to Liu, describes a buck converter LED driver circuit is provided. The driver circa, includes a buck power stage, a rectified AC voltage source, a voltage waveform sampler, and a control circuit.

U.S. Pat. No. 6,894,464 to Zhang, describes a multi-phase synchronous buck converter having plural single phase synchronous buck converter stages, connected together to provide an output current to a load. A sensing circuit in each converter stage includes a variable gain current sense amplifier.

U.S. Pat. No. 6,803,750 to Zhang, describes a device constructed of a plurality of single phase buck converter stages, and a sensing circuit for each converter stage to generate an output signal representative of the output current provided by that converter stage.

WO 1999031790 to Clark et al, describes a regulator with a sampling circuit that makes measurements of an electrical characteristic of the voltage regulator at discrete moments of time. A feedback circuit is coupled to the sampling circuit and the switch, and is configured to use the measurements to control the duty cycle to maintain the DC voltage substantially constant.

In these prior art embodiments, the solution to establish a sampling circuit in switching regulator utilized various alternative solutions.

SUMMARY

It is desirable to provide a solution to address an efficient voltage regulator with minimal power consumption.

It is desirable to provide a solution with improved sampling timing.

It is desirable to provide a solution with improved accuracy of the output current monitor.

A principal object of the present disclosure is to provide a circuit with a delay circuit which delays the master clock for the PWM controller.

Another further object of the present disclosure is to provide a circuit that generates PWM signals for the output stage, where the PMOS "on" signal, pdrv, starts when delayed clock rises and NMOS ndrv is activated during pdrv is deactivated.

Another further object of the present disclosure is to provide a circuit whose output stage PMOS is turned on during pdrv is active, and NMOS is turned on during ndrv is active.

Another further object of the present disclosure is to provide a circuit whose sampling signal generator generates a sampling signal nsample. Nsample is activated first delay signal Td1 after ndrv is activated and deactivated at rising edge of master clock.

Another further object of the present disclosure is to provide a sense circuit that estimates the average output current using the average of the voltage drop across the NMOS transistor during the nsample signal is activated.

In summary, a circuit providing switching regulation with an improved current monitor, comprising a pulse width modulation (PWM) controller configured to provide P- and N-drive signals, an output stage connected to the PWM controller and configured to provide switching, comprising a high-side and low-side transistor, driven by said P- and N-drive signals, respectively, a sense circuit configured to provide output current sensing from the output stage during a sampling period when the N-drive signal is active, and a sampling timing generator configured to provide a an n-sampling signal to the sense circuit, wherein a start of said n-sampling signal is delayed by a first delay after the sampling period and said n-sampling signal is ended prior to an end of the sampling period by a second delay.

In addition, a circuit providing switching regulation with an improved current monitor comprising a pulse width modulation (PWM) controller configured to provide an output signal voltage, an output stage configured to provide switching comprising a first and second transistor, a sense circuit configured to provide output current information sensing from said output stage, a sample timing generator configured to provide a first delay signal to said sense circuit wherein said sampling timing generator comprises a first delay circuit, a first flip-flop coupled to an inverter, whose inverter is coupled to an AND logic gate whose output is a second flip-flop, wherein second flip-flop is further coupled to the first delay circuit, and a master clock configured to provide a second delay signal to said PWM controller and configured to provide a signal to said sample timing generator.

In addition, a second embodiment of an output current monitor implemented in a buck regulator contains a second sampling timing generator implementation. The buck is composed of PWM controller and output stage. Output current monitor is sampling timing generator, sampler and sense circuit. The PWM controller has an input signal from Master clock signal, followed by second delay element Delay Td2, and a second input signal from Error amplifier. The Error amplifier receives a vout signal and reference signal vref. The PWM controller generates two output signals pdrv and ndrv. The Output stage contains PMOS and a pre-drive inverter, and NMOS. The Output stage drives node LX which is connected to inductor, capacitor load C, and Load for the output voltage level vout. The sample timing generator receives a signal from ndrv. The sample timing generator contains a first delay element Delay Td1 followed by a 3-input logic gate. Additionally it contains a signal from the Master clock to a second 2-input logic gate, and a second signal from the delayed clock signal to an inverter. The logic gate output is connected to the 3-input logic gate. The output of the Sampling timing generator is connected to the Sense to generate an Output current information.

In addition, a method is disclosed in accordance with the embodiment of the disclosure. A method of providing an improved current monitor in a switching regulator comprising the steps of a first step, (a) providing a circuit on a pulse width modulation (PWM) controller, a master clock delay circuit, an output stage, a sampling timing generator, and a sense circuit, a second step (b) sampling the inductor current during an NMOS active period, a third step, (c) starting the sampling after a first delay after a start of the NMOS active period, and a fourth step (d) ending the sampling a second delay period before a PMOS active period begins.

Other advantages will be recognized by those of ordinary skill in the art.

BRIEF DESCRIPTION OF THE DRAWINGS

The present disclosure and the corresponding advantages and features provided thereby will be best understood and appreciated upon review of the following detailed description of the disclosure, taken in conjunction with the following drawings, where like numerals represent like elements, in which.

DETAILED DESCRIPTION

Figure 1:
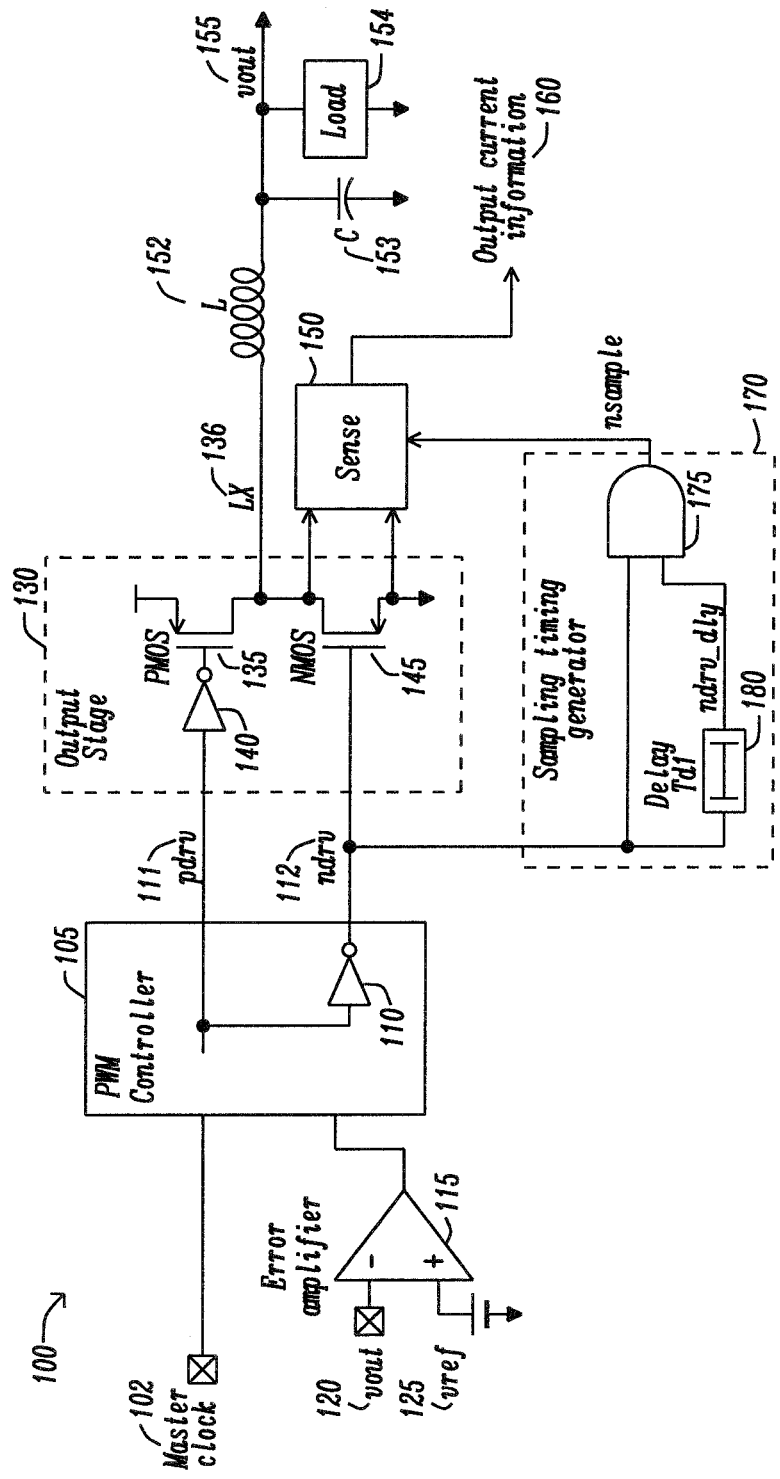
FIG. 1 is a circuit schematic of a prior art of a switching regulator.
Figure 2:
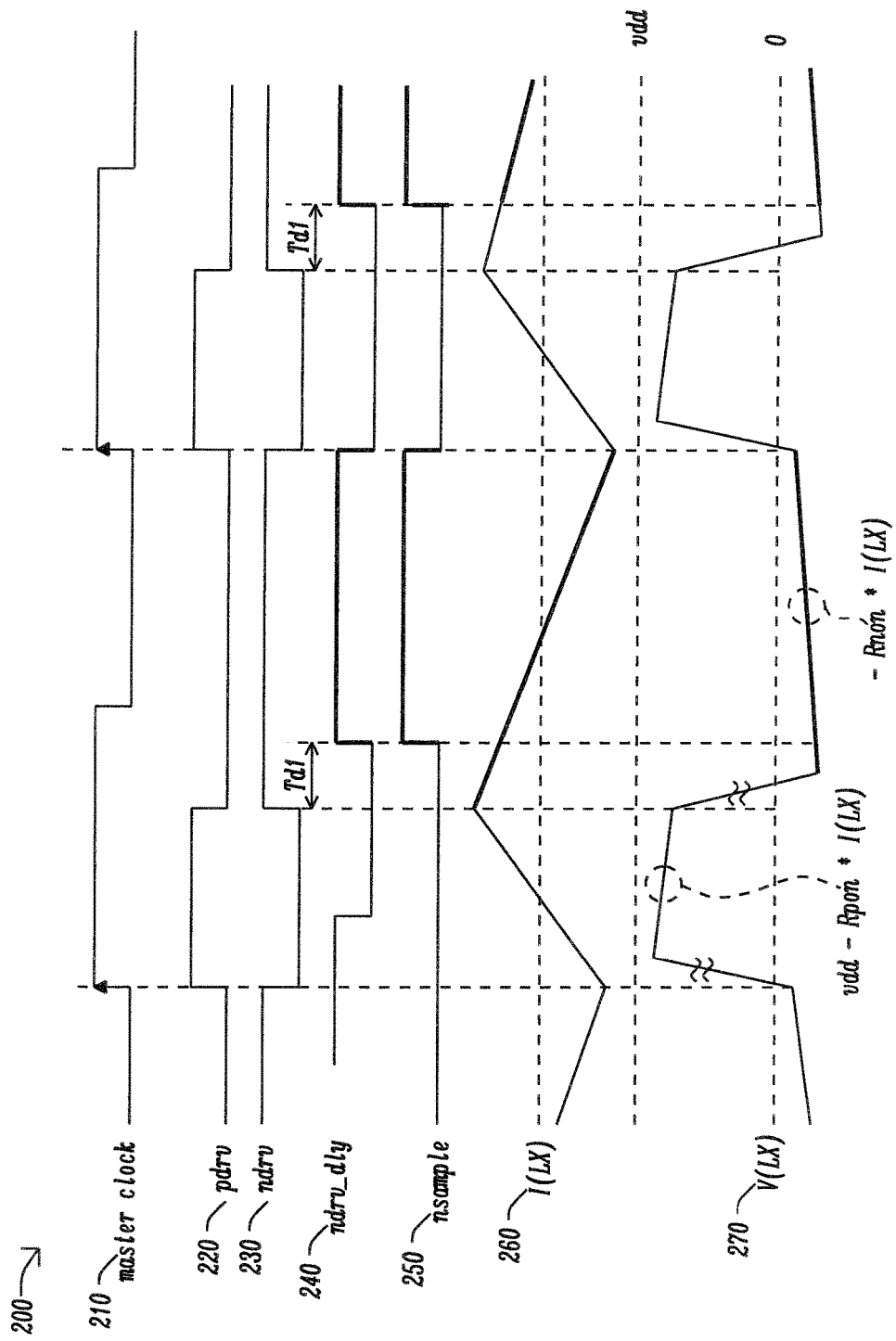
FIG. 2 is a timing diagram of a prior art of a switching regulator.
Figure 3:
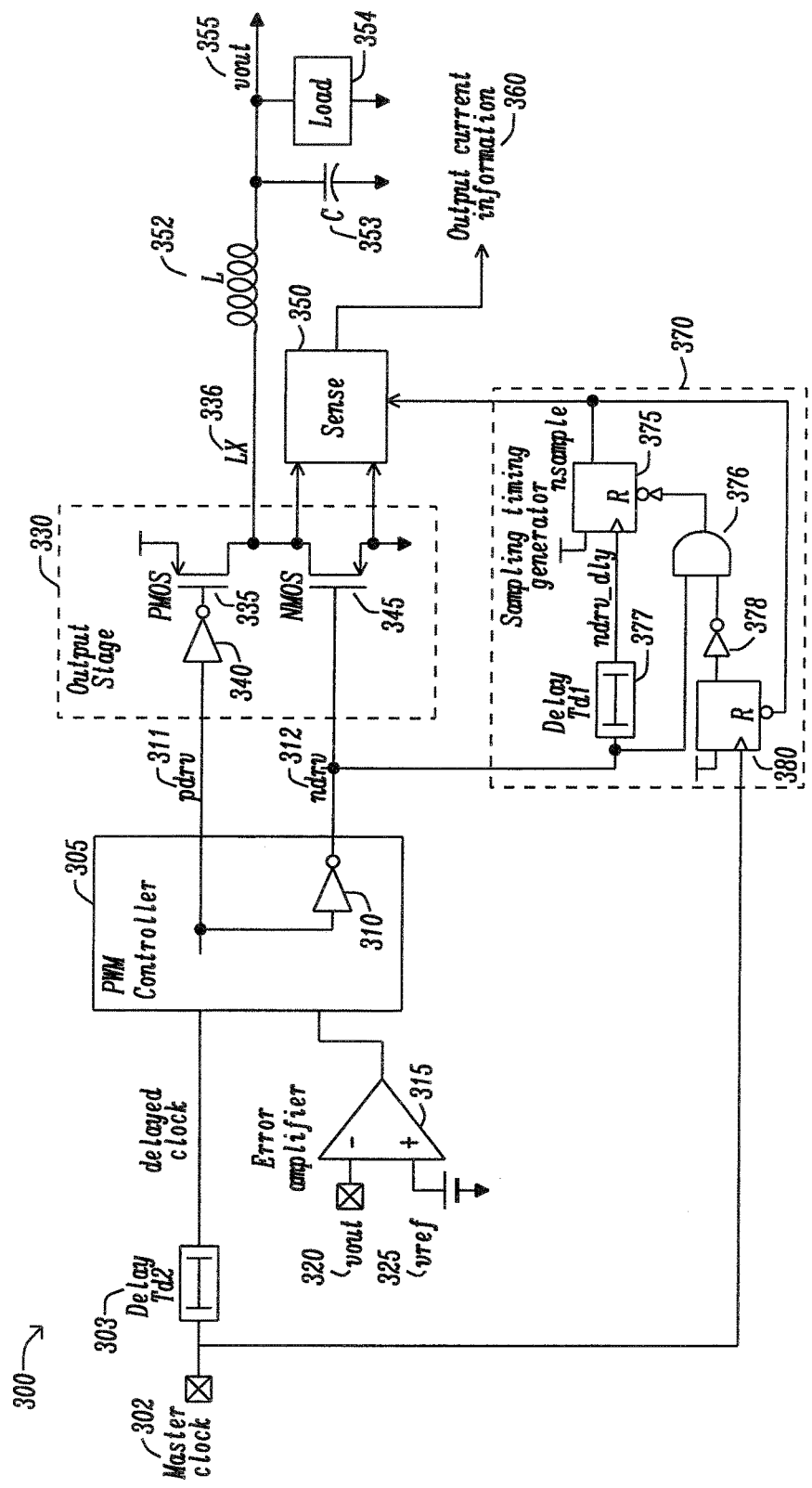
FIG. 3 is a circuit schematic in accordance with the first embodiment of the disclosure.

FIG. 3 is a circuit schematic in accordance with the first embodiment of the disclosure. FIG. 3 shows a block diagram of the invention. The Master clock 302 is delayed by the delay element Delay Td2 303 and used for PWM controller 305. Sampling signal nsample is generated in the Sampling timing generator 370. It starts the first delay element Delay Td1 377 after ndrv is activated. Its end is the second delay element Delay Td2 303 earlier than ndrv, because nsample is reset by Master clock 302 but signal ndrv 312 is reset by delayed clock. This sampling timing generator is logic circuit and various kinds of implementations are possible. The necessary elements are as follows: (1) the first flip-flop which is set by rise of master clock and reset when sampling signal is inactive; (2) the second flip-flop of which output is sampling signal which is set by delayed ndrv, and reset when ndrv is inactive or when first flip-flop is active, (3) and a delay which is generated delayed ndrv from ndrv.

FIG. 3 shows average output current monitor implemented in a buck regulator. The buck 300 is composed of PWM controller 305 and output stage 330. Output current monitor is sampling timing generator 370, sampler and sense circuit 350. The PWM controller 305 has an input signal from Master clock signal 302, followed by the second delay element Delay Td2 303, an a second input signal from Error amplifier 315. The Error amplifier 315 a vout signal 320 and reference signal vref 325. The PWM controller 305 generates two output signals pdrv 311 and ndrv 312. The Output stage 330 contains PMOS 335 and pre-drive inverter 340, and NMOS 345. The Output stage 330 drives node LX 336 which is connected to inductor 352, capacitor load C 353, and Load 354 for the output voltage level vout 355. The sample timing generator 370 receives a signal from ndrv 312. The sample timing generator 370 contains first delay element Delay Td1 377 followed by a flip-flop 375. Additionally it contains a signal from the Master clock 302 to a second flip-flop 380, an inverter 378, an AND logic gate 376 whose output is connected to flip-flop 375. The output of the Sampling timing generator 370 is connected to the Sense 350 to generate an Output current information 360.

Figure 4:
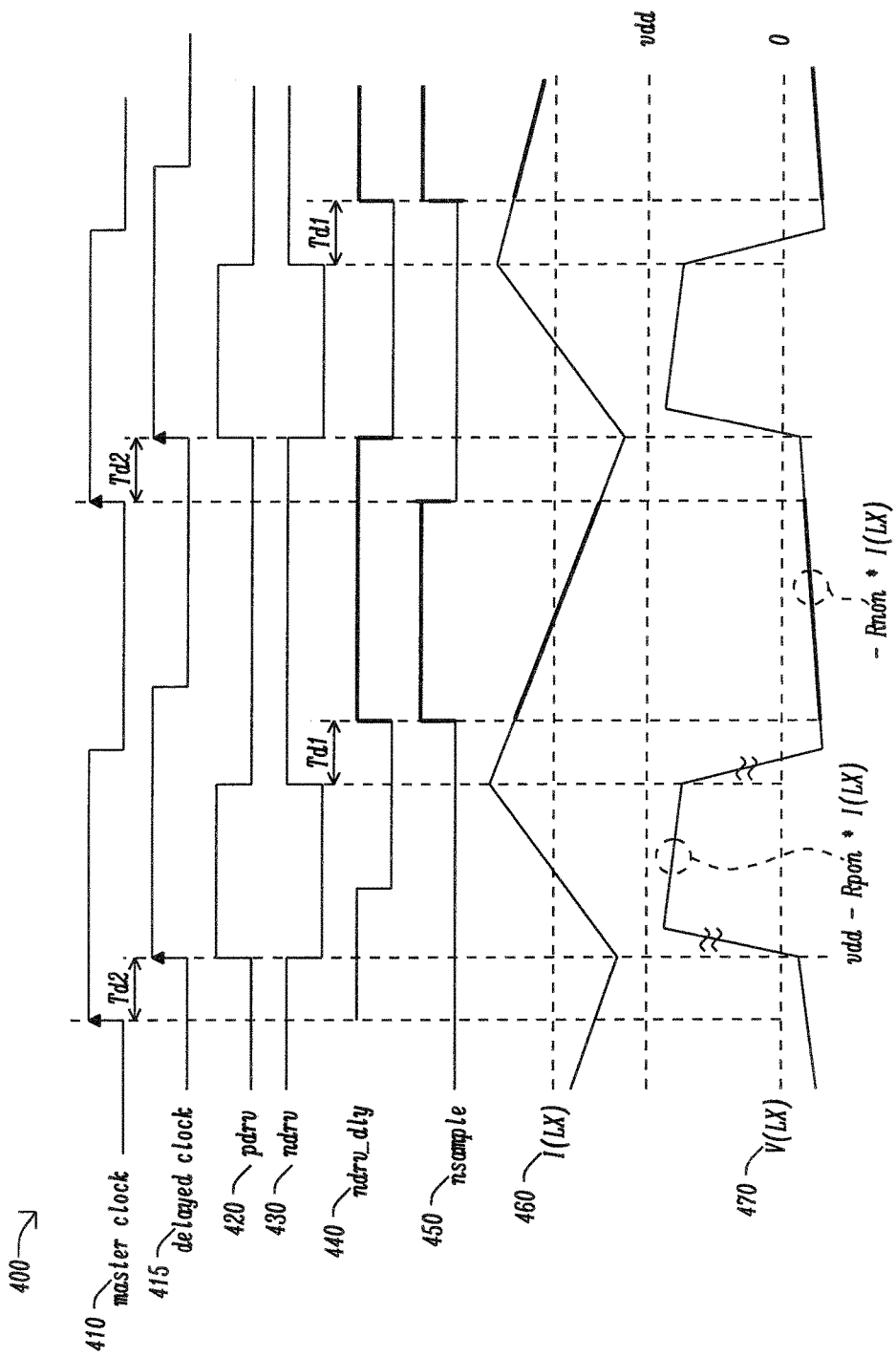
FIG. 4 is a timing diagram in accordance with the first embodiment of the disclosure.

FIG. 4 shows the timing diagram 400 for the signals. The master clock PWM controller signal 410, has also a delayed clock signal 415, that generates PWM signals, signal pdrv 420 and signal ndrv 430. Signal pdrv is activated with signal master clock rising 410. Pulse width of signal pdrv is determined by the control signal from the error amplifier. When signal pdrv 420 is deactivated, signal ndrv 430 is activated immediately and keeps active until signal master clock rising 210.

Output stage 430 is composed of PMOS 135 and NMOS 145. PMOS is turned on when signal pdrv is active and NMOS is turned on when signal ndrv is active. The output, LX node 136 swings almost rail-to-rail and the inductor current swing in triangular waveform. The voltage drop is caused by the inductor current. The voltage drop during NMOS is turned on is expressed as Rnon*I(LX) using NMOS on-resistance Rnon.

FIG. 4 is a timing diagram in accordance with the first embodiment of the disclosure. Timing chart is shown in FIG. 4. FIG. 4 highlights signal master clock 410, signal delayed clock 415, signal p-channel pdrv 420, signal n-channel ndrv 430, n-channel drive ndrv delay signal ndrv_dly 440, sample signal nsample 450, and current and voltage of the LX node 336, I (LX) 460, and V (LX) 470.

The center of nsample signal is shifted by the first signal delay Td1 and the second signal delay Td2. The sensing error due to timing shift is expressed as:

$$\Delta Isense = dI_{LX}/dt * (Td1-Td2)/2 = -Vout/L * (Td1-Td2)/2$$

By using identical delay circuits for the first delay element Delay Td1 and the second delay element Delay Td2, for the delay signal generation, the sensing error can be minimized.

Figure 5:
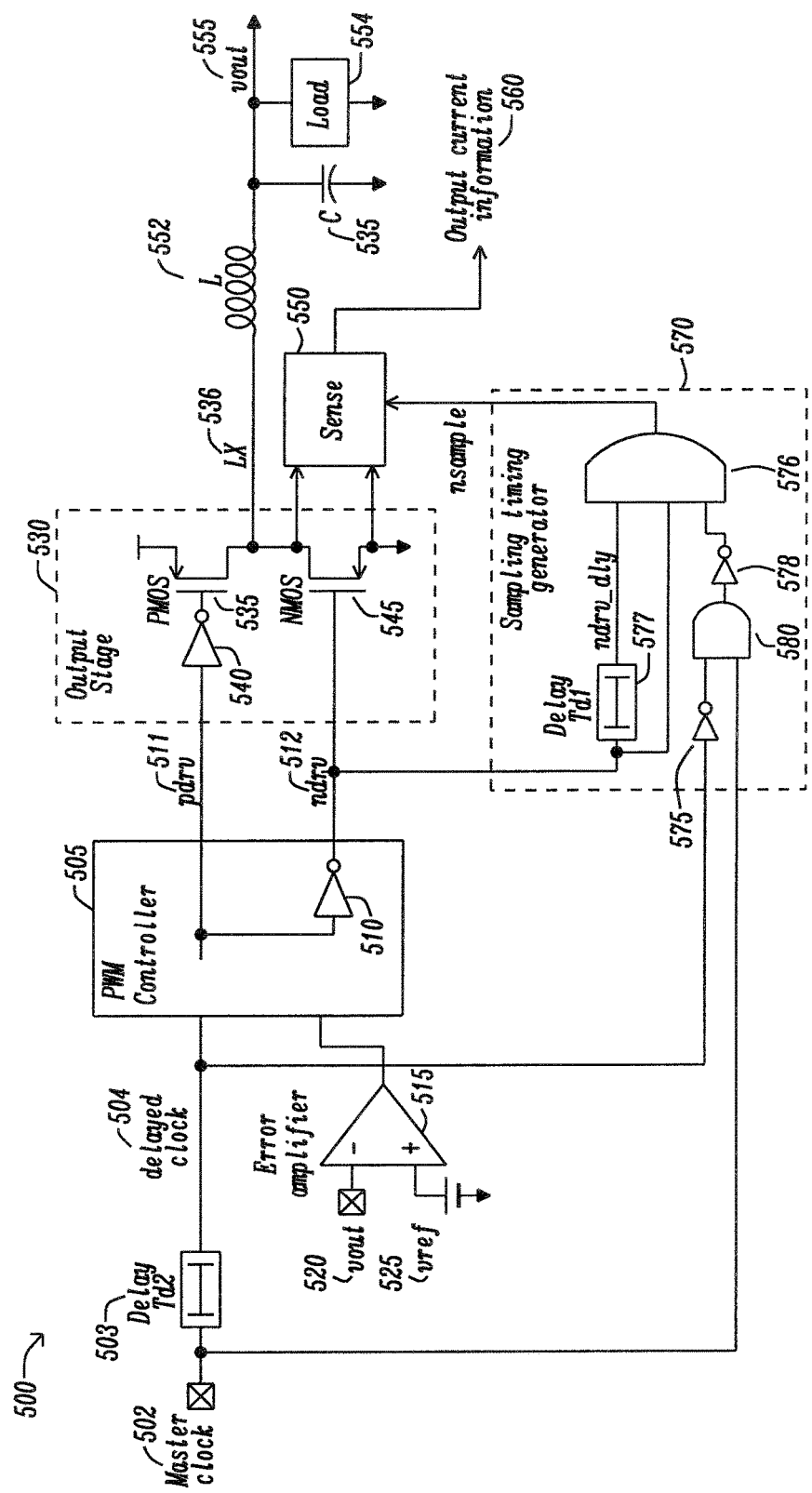
FIG. 5 is a circuit schematic in accordance with the second embodiment of the disclosure; and, FIG. 6 is a method in accordance with the first embodiment of the disclosure.

FIG. 5 is a circuit schematic in accordance with the second embodiment of the disclosure. FIG. 5 shows average output current monitor implemented in a buck regulator. The essential elements in this implementation for the sampling timing generator are: (1) Sampling timing is generated as AND of ndrv, ndrv_dly and mask signal; (2) Ndrv_dly is delay of ndrv, and (3) a mask signal is inactive only from master clock's rise to delayed clock's rise. The buck 500 is composed of PWM controller 505 and output stage 530. Output current monitor is sampling timing generator 570, sampler and sense circuit 550. The PWM controller 505 has an input signal from Master clock signal 502, followed by the second delay element Delay Td2 503, and a second input signal from Error amplifier 515. The Error amplifier 515 has two inputs, with a vout signal 520 and reference signal vref 525. The PWM controller 505 generates two output signals pdrv 511 and ndrv 512. The Output stage 530 contains PMOS 535 and pre-drive inverter 540, and NMOS 545. The Output stage 530 drives node LX 536 which is connected to inductor 552, capacitor load C 535, and Load 554 for the output voltage level vout 555. The sample timing generator 570 receives a signal from ndrv 512. The sample timing generator 570 contains first delay element Delay Td1 577 followed by a 3-input logic gate 576. Additionally it contains a signal from the Master clock 502 to a second 2-input logic gate 580, and a second signal from the delayed clock signal 504 to an inverter 575. The logic gate 580 output is connected to the 3-input logic gate 576. The output of the Sampling timing generator 570 is connected to the Sense 550 to generate an Output current information 560.

Figure 6:
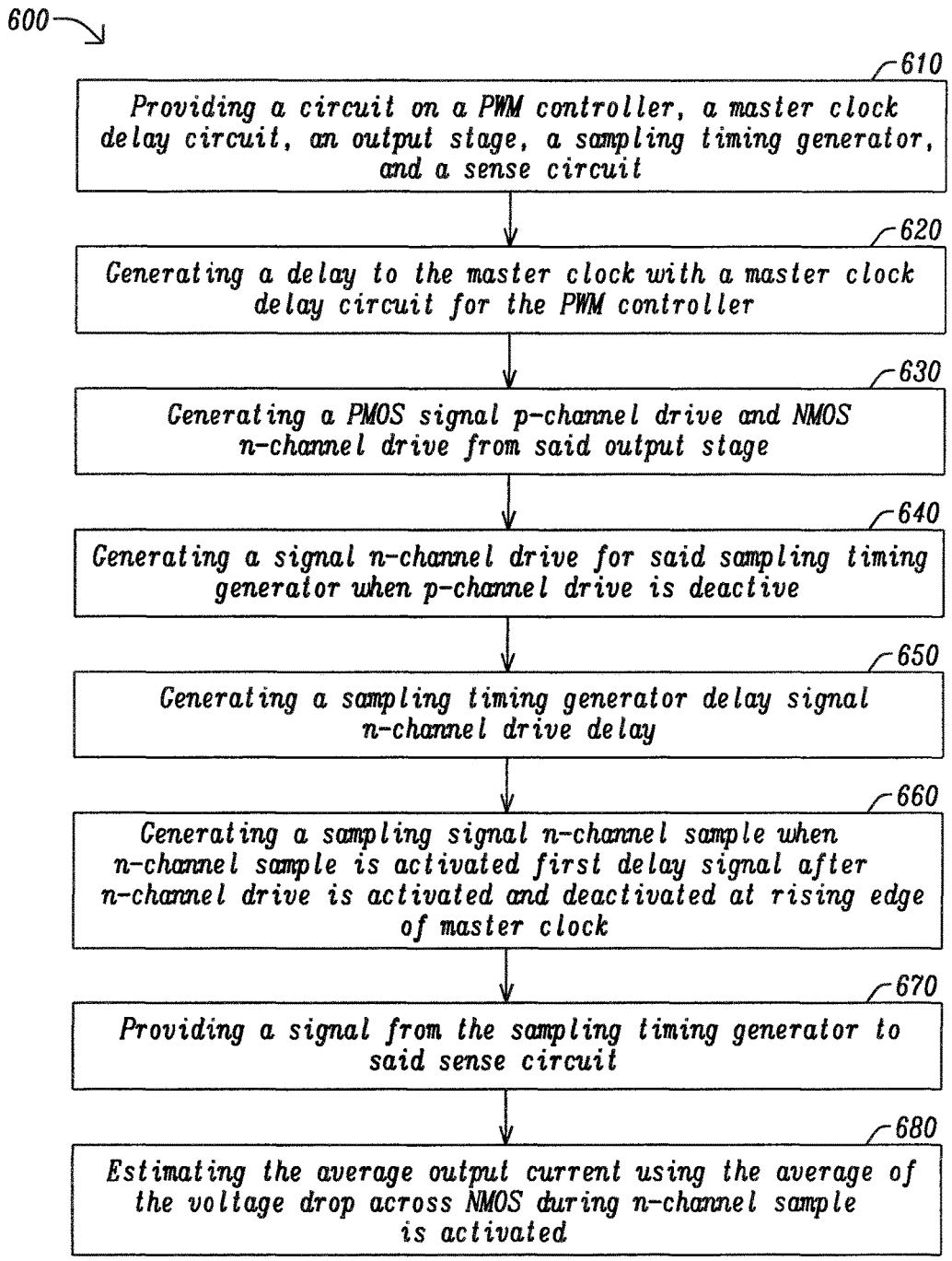

FIG. 6 is a method in accordance with the first embodiment of the disclosure. A method 600 of providing an improved current monitor in a switching regulator comprising the steps of a first step 610, (a) providing a circuit on a PWM controller, a master clock delay circuit, an output stage, a sampling timing generator, and a sense circuit, a second step 620 (b) generating a delay to the master clock with a master clock delay circuit for the PWM controller, a third step 630 (c) generating a PMOS signal p-channel drive, and NMOS n-channel drive from said output stage, a fourth step 640 (d) generating a signal n-channel drive for said sampling timing generator when p-channel drive is deactive, a fifth step, 650 (e) generating a sampling timing generator delay signal n-channel drive delay, a sixth step 660 (f) generating a sampling signal n-channel sample when n-channel sample is activated Td1 after n-channel drive is activated and deactivated at rising edge of master clock, a seventh step 670 (g) providing a signal from the sampling timing generator to said sense circuit, and, an eight step 680 (h) estimating the average output current using the average of the voltage drop across NMOS during n-channel sample is activated.

It should be noted that the description and drawings merely illustrate the principles of the proposed methods and systems. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the proposed methods and systems and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Other advantages will be recognized by those of ordinary skill in the art. The above detailed description of the disclosure, and the examples described therein, has been presented for the purposes of illustration and description. While the principles of the disclosure have been described above in connection with a specific device, it is to be clearly understood that this description is made only by way of example and not as a limitation on the scope of the disclosure.

What is claimed is:

1. A circuit providing switching regulation with an improved current monitor, comprising:
   a pulse width modulation (PWM) controller configured to provide P- and N-drive signals;
   an output stage connected to said PWM controller and configured to provide switching, comprising a high-side and low-side transistor, driven by said P- and N-drive signals, respectively;
   a sense circuit configured to provide output current sensing from said output stage during a sampling period when said N-drive signal is active;
   a sampling timing generator configured to provide an n-sampling signal to said sense circuit, wherein a start of said n-sampling signal is delayed by a first delay after a start of said sampling period and said sampling period is ended by a second delay after said n-sampling signal is ended, wherein said sampling timing generator comprises a first flip-flop coupled to a master clock, a first delay circuit coupled to a second flip-fop, an inverter coupled to said first flip-flop, and an AND logic gate coupled to said inverter wherein said sampling timing generator comprises:
said first flip-flop coupled to a master clock configured to set by a rise of said master clock and configured to be reset when said n-sampling signal is inactive; and
said first delay circuit coupled to a second flip-flop wherein said second flip-flop is configured to be set by a delayed N-drive signal, and configured to reset when said N-drive signal is inactive or when said first flip-flop is active, and said first delay circuit is configured to generate the delayed N-drive signal from said N-drive signal.

2. The circuit of claim 1, wherein said low-side transistor is an n-channel MOS (NMOS).

3. The circuit of claim 2, wherein said sense circuit is configured to receive a signal from said NMOS.

4. The circuit of claim 1, wherein said pulse width modulation (PWM) controller is configured to receive a delayed clock signal from a second delay signal and configured to receive an input signal from an Error amplifier.

5. The circuit of claim 1, wherein said sampling timing generator is configured to receive a signal N-drive from said pulse width modulation (PWM) controller.

6. The circuit of claim 1, wherein said sampling timing generator is configured to receive said master clock output signal from said master clock to said first flip-flop.

7. The circuit of claim 1, wherein said first flip-flop is configured to provide an output signal to said inverter.

8. The circuit of claim 1, wherein said n-drive signal and said inverter of said sampling timing generator are configured to provide signals to said AND logic gate.

9. The circuit of claim 1, wherein said AND logic circuit is configured to provide a reset signal to said second flip-flop.

10. The circuit of claim 1 wherein said second flip-flop is configured to provide a signal to said sense circuit.

11. The circuit of claim 1, wherein sensing error is minimized when said first time delay and said second time delay are identical.

12. A method of providing an improved current monitor in a switching regulator comprising the steps of:
providing a pulse width modulation (PWM) controller having a master clock delay circuit as an input, an output stage driven by said PWM controller, a sampling timing generator, and a sense circuit wherein said output stage comprises a high-side device and a low-side device;
wherein said master clock delay circuit delays said master clock by a first delay period;
wherein said sampling timing generator comprises a delay circuit providing a second delay period;
said sampling timing generator providing a sampling signal to said sense circuit for sampling an inductor current during an active period of said low side device;
starting the sampling after said first delay period after a start of the active period of said low-side device; and
ending the sampling by said second delay period before an active period of said high-side device begins.

13. The method of claim 12, further comprising the steps of:
estimating an average output current using an average of a voltage drop across said low-side device-during said sampling.

14. The method of claim 13 wherein the sampling timing generator further comprises a delay circuit, a first flip-flop, an inverter, a second flip-flop, and an AND logic gate wherein said delay circuit outputs a signal ndrv_dly to said a logic gate, and wherein said inverter provides said signal to a first counter, and wherein said first counter outputs said signal to said second counter, and said second counter outputs said signal to said AND logic gate.

15. The method of claim 12, wherein said high-side device is a PMOS transistor, and said low-side device is an NMOS transistor.

16. The method of claim 12 wherein said high-side device is an NMOS transistor and said low-side device is a PMOS transistor.

* * * * *